(12) United States Patent
Ponoth et al.

(10) Patent No.: US 8,492,270 B2
(45) Date of Patent: Jul. 23, 2013

(54) STRUCTURE FOR NANO-SCALE METALLIZATION AND METHOD FOR FABRICATING SAME

(75) Inventors: Shom Ponoth, Clifton Park, NY (US);
David V Horak, Albany, NY (US);
Elbert E Huang, Carmel, NY (US);
Sivananda K Kanakasabapathy, Niskayuna, NY (US); Charles W Koburger, III, Delmar, NY (US);
Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 339 days.

(21) Appl. No.: 12/885,665

(22) Filed: Sep. 20, 2010

(65) Prior Publication Data

US 2012/0068346 A1    Mar. 22, 2012

(51) Int. Cl.
*H01L 21/4763*    (2006.01)

(52) U.S. Cl.
USPC .................................. 438/637; 257/E21.575

(58) Field of Classification Search
USPC .................................. 438/637; 257/E21.575
See application file for complete search history.

(56) References Cited

U.S. PATENT DOCUMENTS

| | | | |
|---|---|---|---|
| 5,512,514 A | 4/1996 | Lee | |
| 5,668,398 A | 9/1997 | Havemann et al. | |
| 5,691,238 A | 11/1997 | Avanzino et al. | |
| 5,693,568 A | 12/1997 | Liu et al. | |
| 5,915,203 A | 6/1999 | Sengupta et al. | |
| 5,958,800 A * | 9/1999 | Yu et al. .................. | 438/720 |
| 6,051,882 A | 4/2000 | Avanzino et al. | |
| 6,208,015 B1 | 3/2001 | Bandyopadhyay et al. | |
| 6,399,476 B2 | 6/2002 | Kim et al. | |
| 6,673,524 B2 | 1/2004 | Ghandehari et al. | |
| 6,861,332 B2 | 3/2005 | Park et al. | |
| 6,908,829 B2 | 6/2005 | Hussein et al. | |
| 7,071,091 B2 | 7/2006 | Clarke et al. | |
| 7,291,562 B2 * | 11/2007 | Chen et al. ................ | 438/692 |
| 7,329,602 B2 | 2/2008 | Wise et al. | |
| 7,595,555 B2 | 9/2009 | Clarke et al. | |
| 8,329,580 B2 * | 12/2012 | Gambee et al. ............ | 438/669 |
| 2002/0155693 A1 | 10/2002 | Hong et al. | |
| 2005/0059255 A1 * | 3/2005 | Varnerin et al. ............ | 438/720 |
| 2008/0085599 A1 * | 4/2008 | Van Haren et al. .......... | 438/637 |

OTHER PUBLICATIONS

Pawan Kapur, et al, "Technology and Reliability Constrained Future Copper Interconnects p Part I: Resistance Modeling", IEEE, vol. 49, No. 4, Apr. 2002, pp. 590-597.

* cited by examiner

*Primary Examiner* — Lex Malsawma
(74) *Attorney, Agent, or Firm* — Katherine S. Brown

(57) ABSTRACT

A method for forming structure aligned with features underlying an opaque layer is provided for an interconnect structure, such as an integrated circuit. In one embodiment, the method includes forming an opaque layer over a first layer, the first layer having a surface topography that maps to at least one feature therein, wherein the opaque layer is formed such that the surface topography is visible over the opaque layer. A second feature is positioned and formed in the opaque layer by reference to such surface topography.

13 Claims, 14 Drawing Sheets

STRUCTURE FOR NANO-SCALE METALLIZATION AND METHOD FOR FABRICATING SAME

FIELD OF THE INVENTION

The present invention relates to a semiconductor structure, and a method of fabricating the same. More particularly, the present invention relates to nano-scale semiconductor metallization that can have higher than conventional aspect ratios and is compatible with very low k dielectric materials. The present invention also provides a method to fabricate such structure while substantially reducing failure due to misalignment, flawed metal deposition, and electromigration.

BACKGROUND OF THE INVENTION

Generally, integrated circuits include a complex network of conductive interconnects fabricated on a semiconductor substrate in which semiconductor devices have been formed. Efficient routing of these interconnects requires formation of multilevel or multilayered schemes, such as, for example, single or dual damascene wiring structures.

Within an interconnect structure, conductive vias run perpendicular to the semiconductor substrate and conductive lines run parallel to the semiconductor substrate. According to conventional damascene processing, lines and vias are created within a dielectric layer. A dielectric layer is patterned to create grooves which become lines and holes which become vias. Metal is deposited on the patterned surface such as by electroplating to fill the grooves and holes. Excess is removed, such as by CMP, thereby forming lines along the top of a given dielectric layer, and forming vias which extend below the lines in order to connect to an underlying layer.

Copper or a Cu alloy has recently been preferred to form the conductive interconnects to provide high speed signal transmission between transistors on a complex semiconductor chip. Copper typically requires a barrier layer to prevent it from migrating into, and thereby degrading the insulating capacity of, surrounding dielectric material. As feature sizes continue to decrease in the ongoing development of more and more densely built integrated circuits, the limitations of dielectric damascene and copper are increasingly apparent. For one, smaller feature size of the conductive features generally requires higher aspect ratio, and it is increasingly difficult to fill such features to form void free metal structures. Forming a barrier layer within high aspect features is particularly difficult. Furthermore, as feature sizes continue to decrease, the barrier cannot scale and hence constitutes a greater fraction of any particular feature. Additionally, as the feature dimensions become comparable to the bulk mean free path, the effective resistivity of copper features will increase because of normegligible electron scattering at the copper-barrier interface and at grain boundaries. See Pawan Kapur et al., Technology and Reliability Constrained Future Copper Interconnects—Part 1 Resistance Modeling, 49: 4, IEEE Transactions on Electron Devices 590 (April 2002).

Some challenges associated with copper damascene can be avoided by forming the interconnect structure by an alternate metal using subtractive metal etch ("SME"), as for example is discussed in U.S. Pat. No. 5,512,514 ("Saile"). In SME, a metal layer is deposited, then etched according to one or more patterns to remove all but the interconnect structures. For example, referring to FIG. 1 which represents a prior art integrated circuit according to Saile, an isolation layer 12 overlies a semiconductor substrate 10. A first metal stack is formed by depositing a first metal layer 21, an optional etch stop layer 22; a second metal layer 23, and an anti-reflective coating layer 24. The stack is etched through to isolation layer 12 according to a first mask for first conductive lines, which mask is formed over layer 24 by patterning a first photoresist layer. The stack is then etched through to etch stop layer 22 according to a second mask for first vias, which mask is formed by patterning a second photoresist layer. A dielectric layer 25 is deposited over the exposed substrate and the etched features to fill the voids formed by such etch steps. A second interconnect layer of lines 31, vias 33, and dielectric 35 can be formed by repeating the process. According to this SME process, that portion of such a nth metal stack covered by both n-level masks forms the vias, and results within the nth dielectric layer, self-aligned vias that extend above metal lines.

A problem with forming multi-layered interconnect structure by subtractive metal etch, however, is the difficulty of correctly positioning features in an upper layer such that they align with features in an underlying layer. Alignment is difficult because the underlying features are not visible under the opaque upper metal layer.

SUMMARY OF THE INVENTION

According to the present invention, the problem of enabling the formation of structures by subtractive etch in proper alignment with features underlying an opaque layer is solved by establishing a first surface topography that maps to the features of interest, forming an opaque layer over the first surface whereby such topography is retained, and referencing that topography to form structures aligned with such underlying features. The invention enables formation of a semiconductor interconnect structure that can have higher than conventional aspect ratios, and provides a method to fabricate such structure while substantially reducing failure due to misalignment and electromigration relative to existing semiconductor interconnect structures.

In one embodiment, the invention provides a method that includes forming an opaque layer over a first layer, the first layer having a surface topography that maps to at least one feature therein, wherein the opaque layer is formed such that the surface topography is visible over the opaque layer. A second feature is positioned and formed in the opaque layer by reference to such surface topography.

In another embodiment, the invention provides a method to form metal interconnects on substrate having a top layer that includes at least one conductive element within dielectric material. The method includes selectively removing a portion of the dielectric material to define at least one topographic feature and a surface topography on the surface of said top layer; and forming a metal layer having substantially the same surface topography over that top layer.

In addition to providing the above described methods, the present invention also provides an interconnect structure. The interconnect structure has at least two layers on a substrate, such layers including metal interconnect structure embedded within dielectric material. Each of such layers includes at least one via that extends to the top of that layer and at least one line formed along the bottom of said layer, and at least one via of the lower layer extends into the upper layer.

DETAILED DESCRIPTION OF THE INVENTION

Embodiments of the present invention will now be described in greater detail by reference to the drawings that accompany the present application. It is noted that the drawings of the present application are provided for illustrative purposes only and are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 2A:
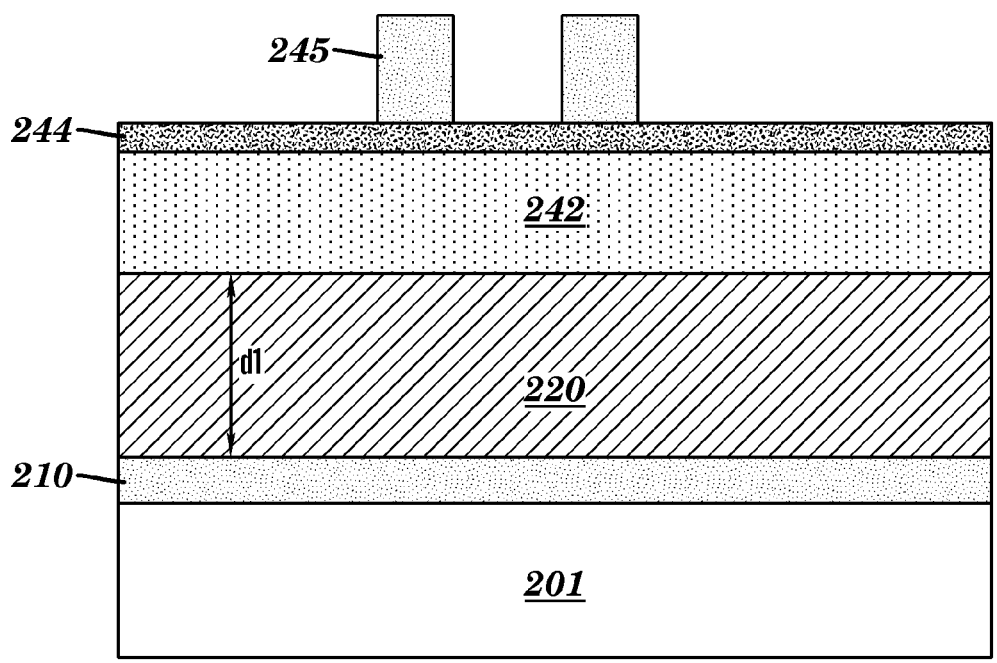
FIGS. 2A-2F illustrate a first exemplary structure according to an embodiment of the present disclosure.

Referring now to FIG. 2A, a first exemplary structure according to a first embodiment of the present disclosure includes a substrate 201, and a first metal layer 220. Intermediate layer 210 is optional and may be an etch stop layer. First metal layer 220 may be deposited by any known deposition process and is preferably a conformal layer with substantially uniform thickness d1. FIG. 2A illustrates a mask layer comprising an organic planarizing layer 242 covered by an optional hard mask 244. First photoresist layer 245 can be patterned by exposing the photoresist to radiation according to a pattern such as that depicted by FIG. 3A and developing the exposed photoresist utilizing a conventional resist developer.

The substrate 201 may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs). Further, the substrate 201 can be single crystalline, polycrystalline, amorphous, or have a combination of at least two of a single crystalline portion, a polycrystalline portion, and an amorphous portion.

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon. When the substrate comprises a combination of an insulating material and a conductive material, the substrate may represent a first interconnect level of a multilayered interconnect structure.

First metal layer 220 is conductive and can be any metal that can be dry etched (such as Al) including but not limited to Al, Cr, Hf, Ir, Mo, Nb, Os, Re, Rh, Ru, Ta, Ti, W, V, Zr, and alloys thereof. First metal layer 220 is preferably formed by one or more of Aluminum, Ruthenium, Tungsten, Tantalum, Titanium or Tungsten. First metal layer 220 can comprise two or more separately deposited materials, which can be deposited in layers, or may form separate regions of said layer. According to one embodiment, a thin under layer can be formed to promote a characteristic in a subsequently formed main metal layer, for example, a particular crystal form or a specific crystal orientation. The material of such under layer would depend upon the material of the main metal layer. Alternatively, an under layer could constitute an etch stop. In another embodiment, an earlier-formed layer may ultimately constitute a conductive line while a later-formed layer may ultimately constitute a via extending up to the next layer from such conductive line. In yet another embodiment, a first metal can be formed within first open regions of a patterned layer, then second openings can be formed in such patterned layer, and a second metal region can be formed by filling such second openings.

Figure 2B:
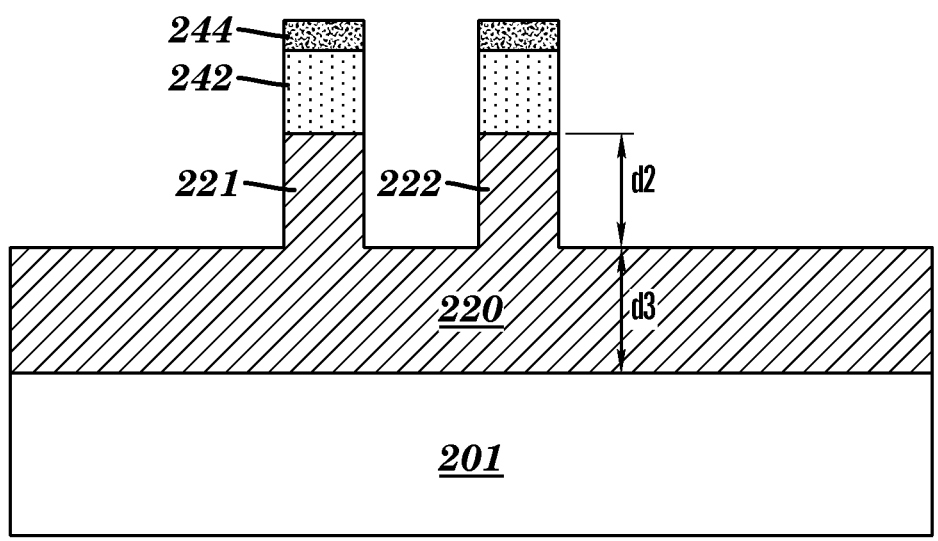

Returning to FIG. 2A, mask layer 242 can be an organic planarizing layer ('OPL') which can be formed of polyimide class materials or commercially available ODL, e.g., JSR NFC series or Shin Etsu ODL series. Mask layer 244 can be a hard mask formed of, for example, silicon oxide, SiN, or silicon-containing antireflective material (SiARC). Mask layers 242 (and 244) can be patterned by dry etching (such as, for example, reactive ion etching, ion beam etching, plasma etching or laser ablation), and/or a wet chemical etching process. FIG. 2B shows that selectively etching metal layer 220 to a depth d2 can transfer the pattern of mask 242 into the upper portion of first metal layer 220 whereby is formed protrusions 221 and 222 having height d2. Such selective etch can be by plasma etching, and when layer 220 comprises tungsten, can be a fluorine based plasma etch.

According to one embodiment, mask 242 is patterned to block subtractive etch only of those portions of metal layer 220 that will become vias. In another embodiment, mask 242 could be first patterned to mask that portion of metal layer 220 that will become lines. According to a third embodiment, a pattern such as that of FIG. 3A can be used to form mask 242 that protects from etching portions of metal layer 220 in addition to those portions that will be vias.

Figure 2C:
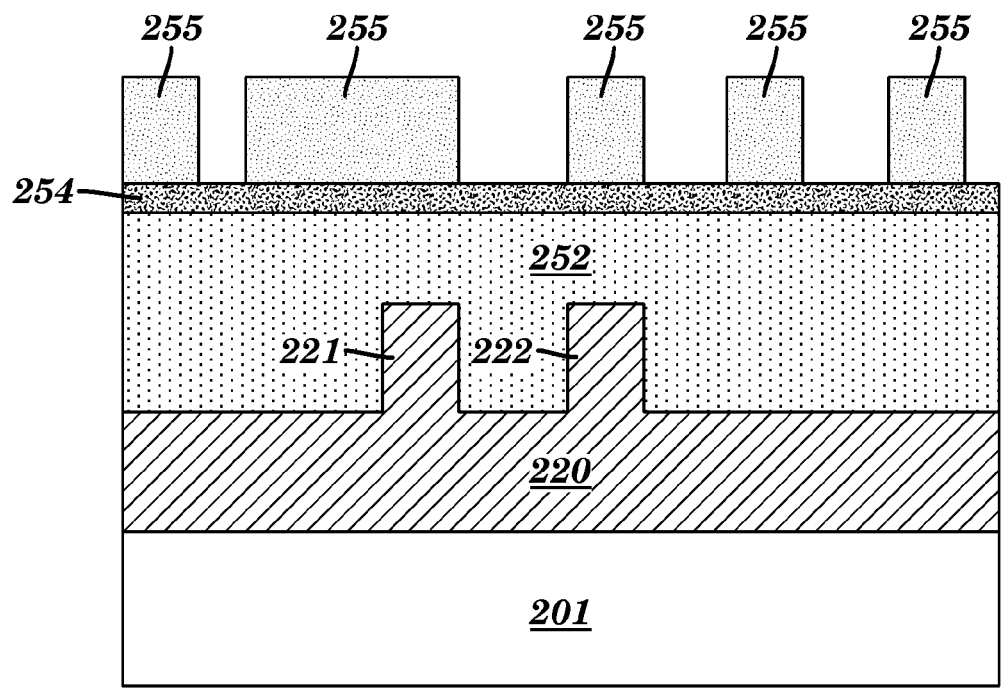

A second patterning sequence can complete the patterning of metal layer 220. As shown in FIG. 2C, a second mask layer including organic planarizing layer 252 covered by optional hard mask 254 can be deposited over exposed metal layer 220. The same materials that are suitable for layer 242 are suitable for layer 252, and layer 252 need not be the same material as layer 242. The same materials that are suitable for layer 244 are suitable for layer 254, and layer 254 need not be the same material as layer 244. First mask 242 (and 244) can optionally be removed prior to deposition of layer 252 (and 254) such as by ashing. If mask layers 252 and 254 are not sufficiently flat, they can be planarized by known methods. Photoresist layer 255 can be deposited and patterned by know methods, as can photoresist layer 245.

Figure 3B:
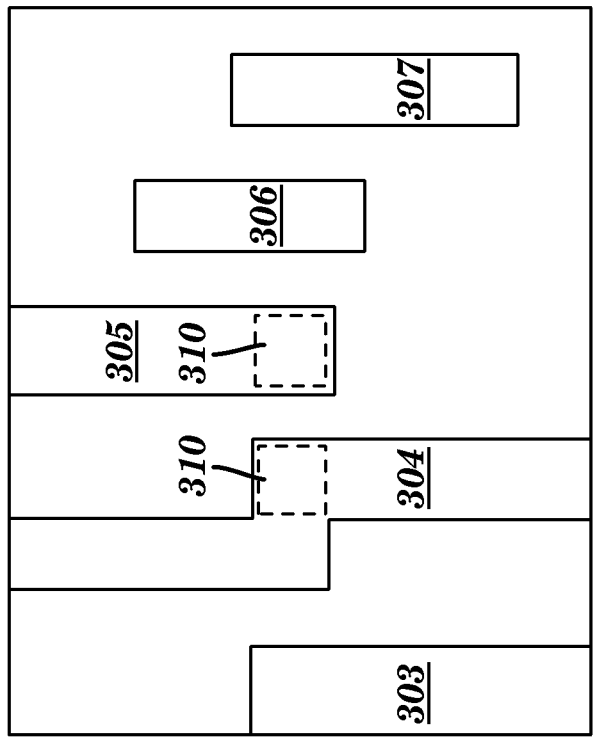
FIGS. 3A and 3B are respectively plan views of exemplary via and line masks for an embodiment of the present disclosure.
Figure 3A:
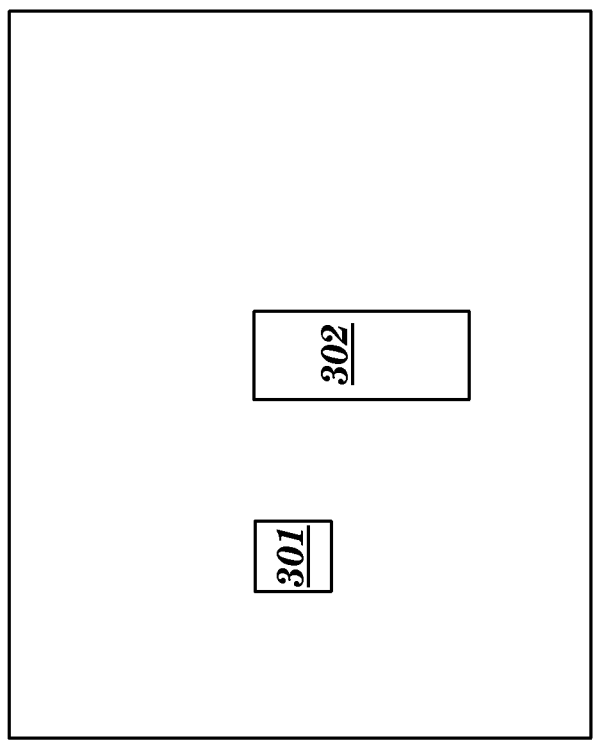

According to some embodiments, the first mask pattern, such as that of FIG. 3A, results in relatively few protrusions such as 221 and 222 corresponding to mask elements 301 and 302. If such protrusions are sufficiently spaced and appropriately shaped, then spin-on deposition of layers 252 and 254 can fill between such protrusions and can form layers of substantially uniform depth without additional planarization steps. Optionally, layers 252 and 254 can have the same depths as layers 242 and 244 respectively. Second photoresist layer 255 can be patterned according to a second pattern, such as that of FIG. 3B, which mask would retain structures corresponding to mask elements 303, 304, 305, 306, and 307.

Figure 2D:
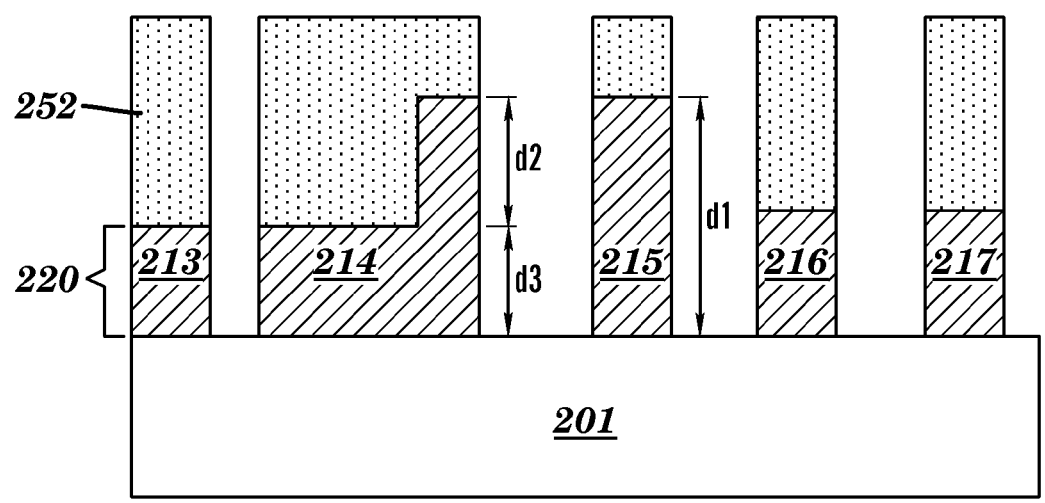

After patterning mask layer 252 (and 254, if present,) according to the pattern of photoresist layer 255, the pattern can be etched through first metal layer 220 as depicted in FIG. 2D. This second etch could be timed or otherwise controlled, such as by inclusion of etch stop layer 210, to end after etching depth d3. Those portions of metal layer 220 masked by both the first and second masks (e.g., regions 310 in FIG. 3B) remain as vias which extend above those portions of metal layer 220 masked by just one or the other of said masks. The etch depth d2 could be equal or different from etch depth d3. An embodiment using patterns exemplified by FIGS. 3A and 3B would form structure 215 comprising a via of height d1 in perfect alignment with a line patterned by masks 302 and 305. The structure formed by 302 where it does not overlap 305 would have a thickness d1-d3, whereas that structure formed by 305 where it does not overlap 302 would have a thickness d1-d2. Similarly, those portions masked by 303, 306, and 307 (which have no overlap with masks 301 and 302) would have a thickness of d1-d2.

While the foregoing contemplates just two patterning masks per metal layer, the present invention can utilize more than two masks to pattern metal layer 220, in which case those portions covered by all such masks would remain as vias, and those portions covered by at least one, but fewer than all such masks would remain as lines. Those lines may, but need not, all become functional conductive interconnects.

Figure 1:
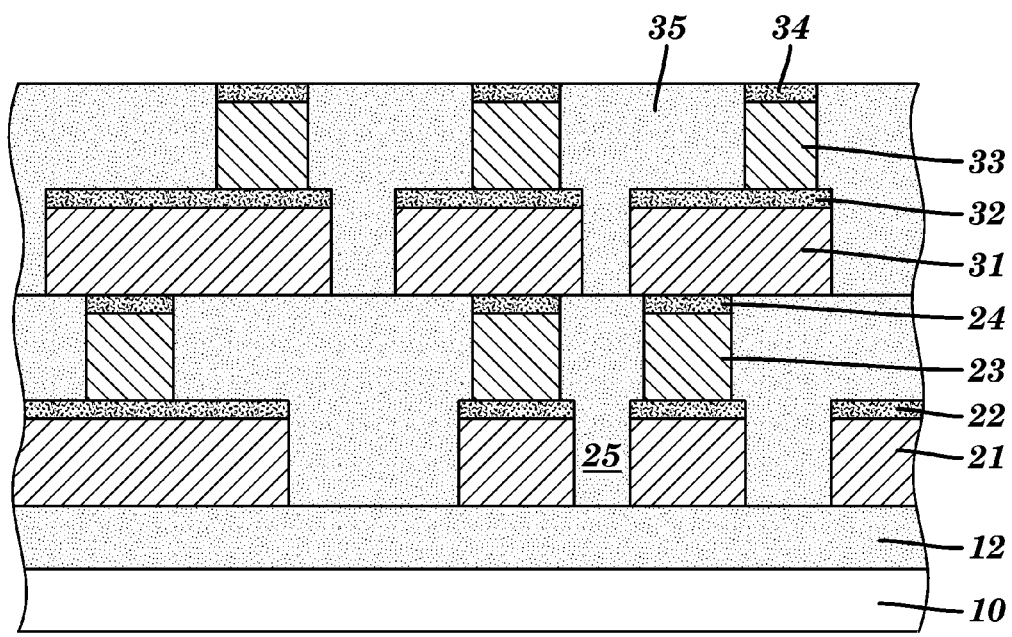
FIG. 1 is a cross section of a prior art interconnect structure.
Figures 1, 2E:
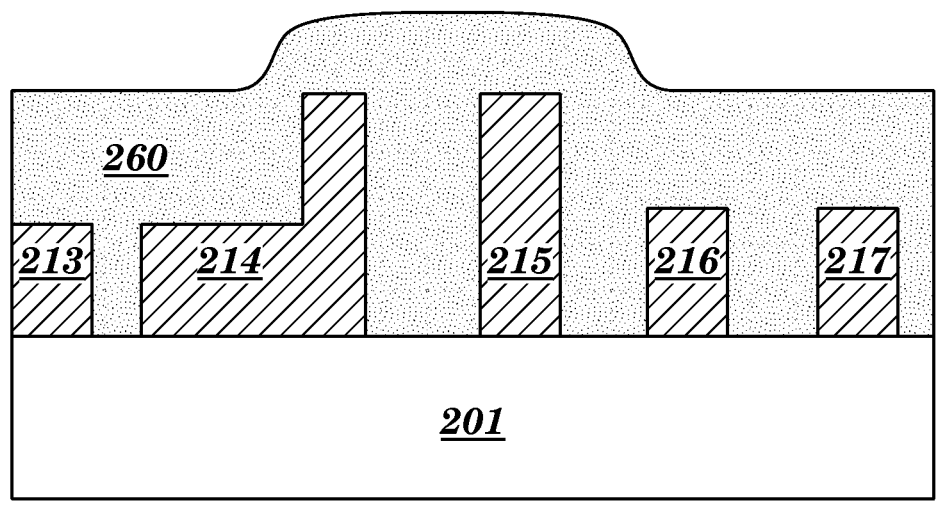

Referring now to FIG. 2E-1, after the patterning of metal layer 220 is complete, dielectric material 260 can be deposited to fill the voids formed by the foregoing patterning steps. Dielectric material 260 can be any interlevel or intralevel dielectric (ILD), including inorganic dielectrics or organic dielectrics, and can be porous or non-porous. Examples of suitable dielectrics that can be used as dielectric material 260 include, but are not limited to SiN, SiC, SiO2, silsesquioxanes, C doped oxides (i.e., organosilicates) that include atoms of Si, C, O and H, including porous versions of the foregoing, or combinations thereof.

Figures 2, 2E:
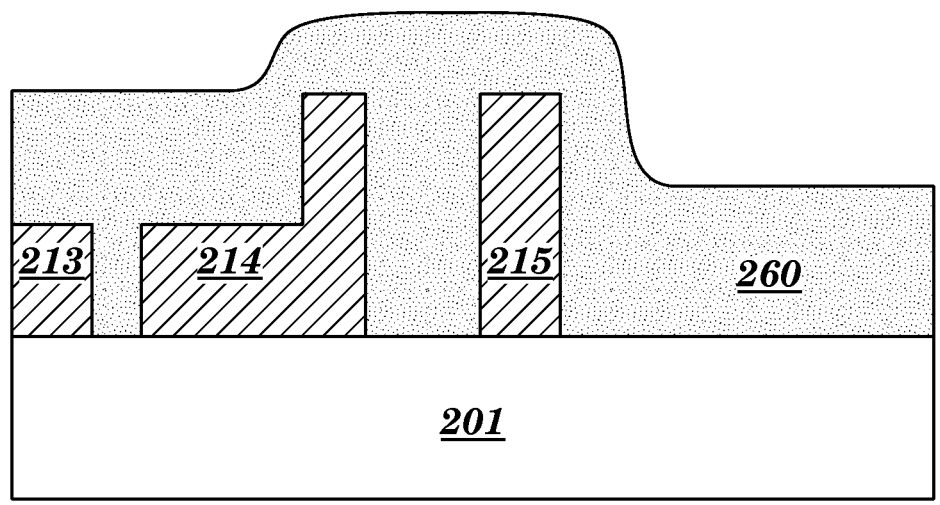

Dielectric material 260 can be deposited utilizing any conventional deposition process including, but not limited to chemical vapor deposition (CVD), plasma enhanced chemical vapor deposition (PECVD), spin-on coating, evaporation, and chemical solution deposition. Spin-on coating can be preferable by resulting in less overburden and thereby reducing the need for or demand upon a subsequent planarization step such as CMP. Preferably, such coating can form a layer of uniform depth such that ILD etch back, rather than CMP, is sufficient to smooth the first-level surface and expose the top of the first-level via structures prior to further formation of interconnect structure. Referring now to FIGS. 2E-1 and 2E-2, it may be advantageous to form dummy lines, e.g. 216 and 217, which lines may not ultimately comprise the interconnect structure but are formed simply to create a more uniform density of structures in a metal layer in order to promote ILD fill of such layer to a uniform depth.

Figure 2F:
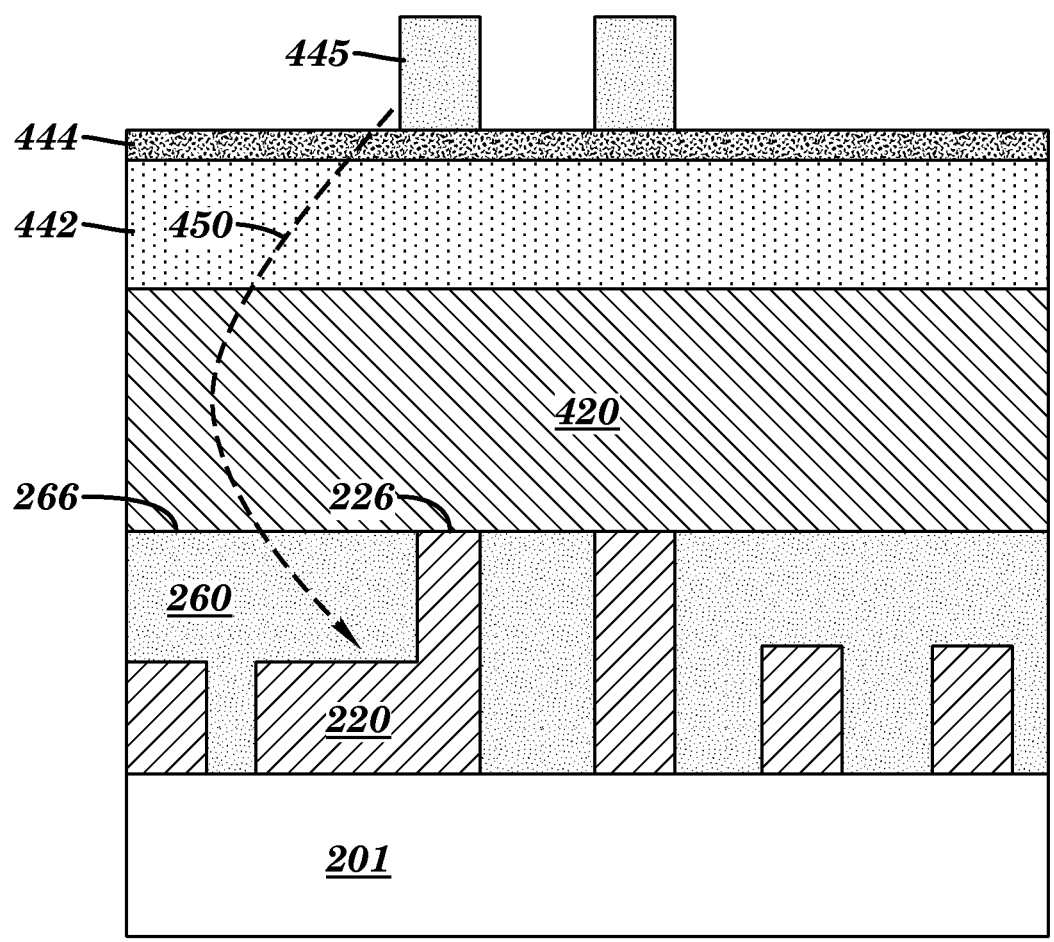

Formation of the first metal layer is completed by a planarization process if necessary, which could be, for example, chemical mechanical polishing and/or grinding to form the lower portion of the structure shown in FIG. 2F such that upper surface 266 is coplanar with exposed surface 226. Typically, chemical mechanical polishing is employed.

Typically, the desired interconnect structure requires more than one metal layer, and perhaps 10, 20, or even more metal layers. Conceptually, a second metal layer 420 can be deposited over the first layer, and patterned by OPL 442, optional hard mask 444, and photoresist 445 in the same fashion as first metal layer 220. In any multi-level integration of interconnect wiring, it is important to form second level lines and vias such that they properly connect with underlying first level lines and vias. In conventional dielectric damascene, metal interconnect structure is formed within and after deposition of a dielectric layer which is typically optically transparent, so alignment can be enabled by optically aligning upper masks and structures with underlying structures. In subtractive metal etch it is not possible to see metal features in the underlying layer by path 450, because the newly deposited second metal layer is opaque.

Figure 4A:
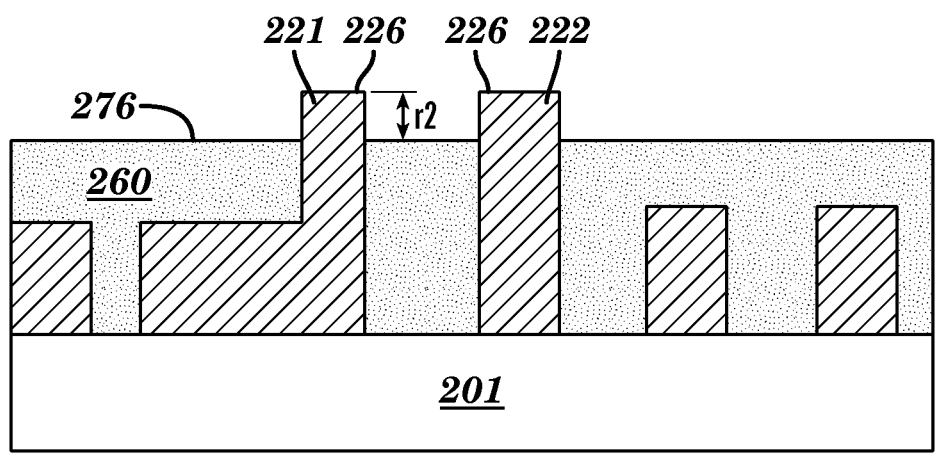
FIGS. 4A-4C illustrate vertical cross-sectional views of a second exemplary structure according to an embodiment of the present disclosure.

This challenge can be overcome by embodiments of the present invention. FIG. 4A shows that prior to deposition of an opaque layer over a first interconnect layer 220, first dielectric 260 can be recessed by known methods such that portions of the first level via structures 221 and 222 form topographic features that protrude by height r2 above the recessed surface 276. The topographic features may be structures formed exclusively for the purpose of providing reference locations that map to underlying features, or may be conductive features, that is, structures that actually constitute electrically active interconnect structure. Alternatively, prior to ILD fill as depicted by FIG. 2E-1 or 2E-2, a layer such as an anti-nucleation layer that would inhibit ILD deposition can be formed over upper portions of the topographic features. According to such alternative embodiment, a planarizing ILD fill would leave such upper portions exposed such that ILD etch back prior to deposition of a second metal layer would be unnecessary. The ILD inhibiting layer could optionally be selectively removed, such as by wet etch, prior to deposition of the next metal layer.

Referring again to FIG. 4A, the distance r2 of this recess measured from the top surface 226 of structures 221 and 222 to the recessed surface 276 may vary depending on the exact recess process and conditions used and would be less than a via height (e.g., d2). Typically, and by way of a non-limiting example, the distant of the recess is from about 2 to about 100 nm, with a distant from about 10 to about 20 nm being even more typical. The dielectric recess process employed in the present invention in forming the structure shown in FIG. 4A includes any etching process (including dry etching and chemical wet etching) that selectively etches the dielectric material 260 relative to material of structures 221 and 222. Typically, the dielectric recess process employed in the present invention includes a chemical etching process or a reactive ion etching process.

Figure 4B:
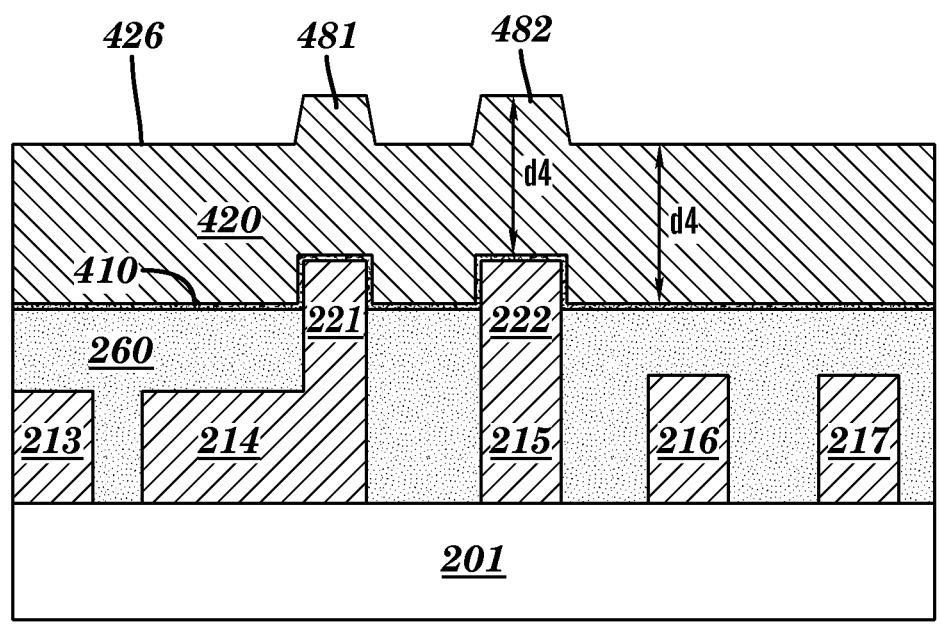

Now with reference to FIG. 4B, adhesion layer 410 can optionally be formed over recessed surface 276 as well as over exposed sidewalls and top surfaces of the protruding structures. Layer 410 may alternatively or additionally function as an etch stop layer or as an underlayer to promote desirable growth of material 420. Adhesion layer 410 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating. The adhesion layer 410 can comprise Ta, TaN, TaAlN, TiAlN, Ti, TiN, Ru, RuN, RuTa, RuTaN, W, WN or any other material that can enhance adhesion at the first dielectric/second metal layer interface or can enhance the structure/process in terms of etch stop or a growth promotion layer. The thickness of the adhesion layer 410 may vary depending on the deposition process used as well as the material employed. Typically, the adhesion layer 410 has a thickness from about 1 to about 10 nm, with a thickness from about 2 to about 5 nm being more typical.

Opaque layer 420 can be formed over the recessed first layer, and preferably is formed by a non-planarizing technique such that opaque layer depth d4 is substantially uniform throughout. By depositing or otherwise forming the opaque layer at a uniform depth directly on the recessed first layer (with or without optional adhesion layer 410), the topography of the first layer can be duplicated and visible as protrusions 481 and 482 of surface 426. Patterning of opaque layer 420 can be aligned with underlying features by reference to protrusions 481 and 482. Specifically, features 221 and 222 are respectively directly below protrusions 481 and 482, and the position of other first-layer features such as 213 or the lines extending from vias 221 and 222 can be directly mapped to said protrusions.

Opaque layer 420 may comprise a conductive metal, including the materials that can form first metal layer 220. The material of opaque layer 420 can be the same or different from the material of first metal layer 220.

Figure 4C:
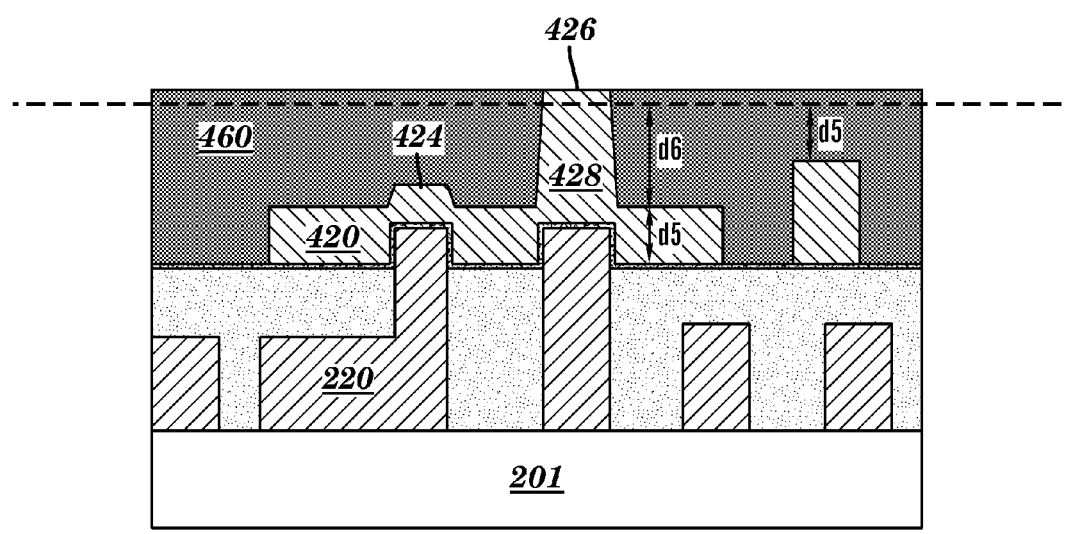
Figure 5A:
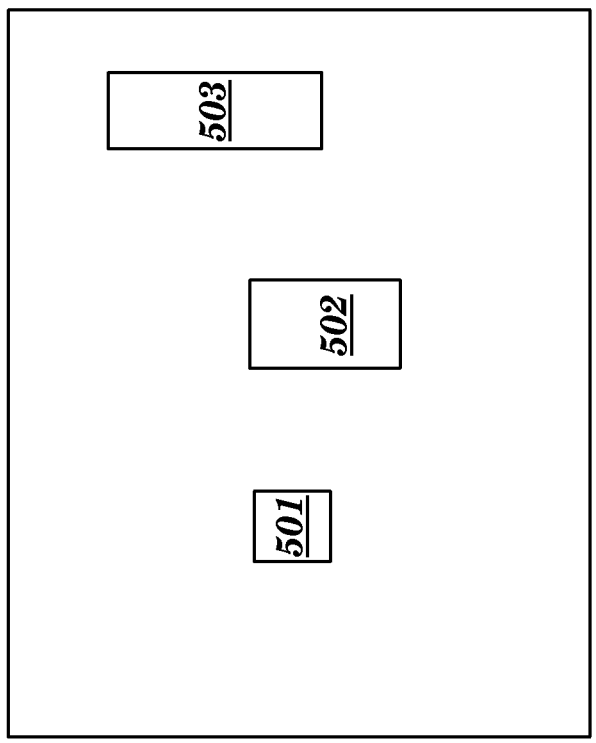
FIGS. 5A and 5B are respectively plan views of exemplary via and line masks for an embodiment of the present disclosure.
Figure 5B:
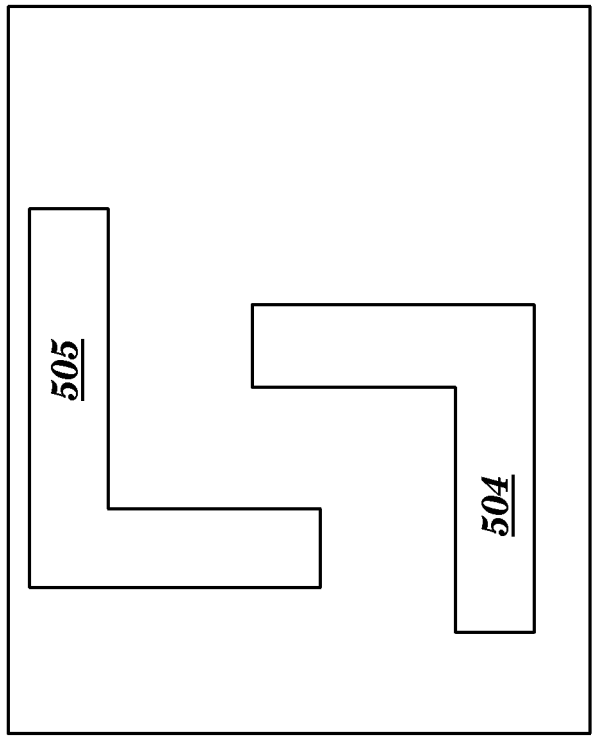

FIG. 4C shows layer 420 patterned according to the patterns of FIGS. 5A and 5B by repeating the process of forming and patterning mask and photoresist layers as described above for patterning layer 220. A mask can be defined on layer 420 utilizing the pattern of FIG. 5A which includes mask elements 502 and 503, and element 501 which is merely a reference location. The pattern of FIG. 5A could be positioned by aligning elements 501 and 502 directly over protrusions 481 and 482. Layer 420 can then be etched to depth d6. Layer 420 can then be etched through the remaining depth d5 according to the pattern of FIG. 5B, where mask elements 504 and 505 are positioned by reference to protrusions 424 and 426. If adhesion layer 410 is present, that part exposed by etching through layer 420 can be optionally removed by selective etch (not shown). Finally, the voids formed by etching layer 420 can be filled by dielectric layer 460, which can be planarized such that the top of dielectric layer 460 is coplanar with exposed top surface 426.

A third metal layer could be formed in the same manner as layer 420 by recessing dielectric layer 460 to form a reference topography and depositing such third metal layer so as to retain that reference topography on its top surface.

Figure 6:
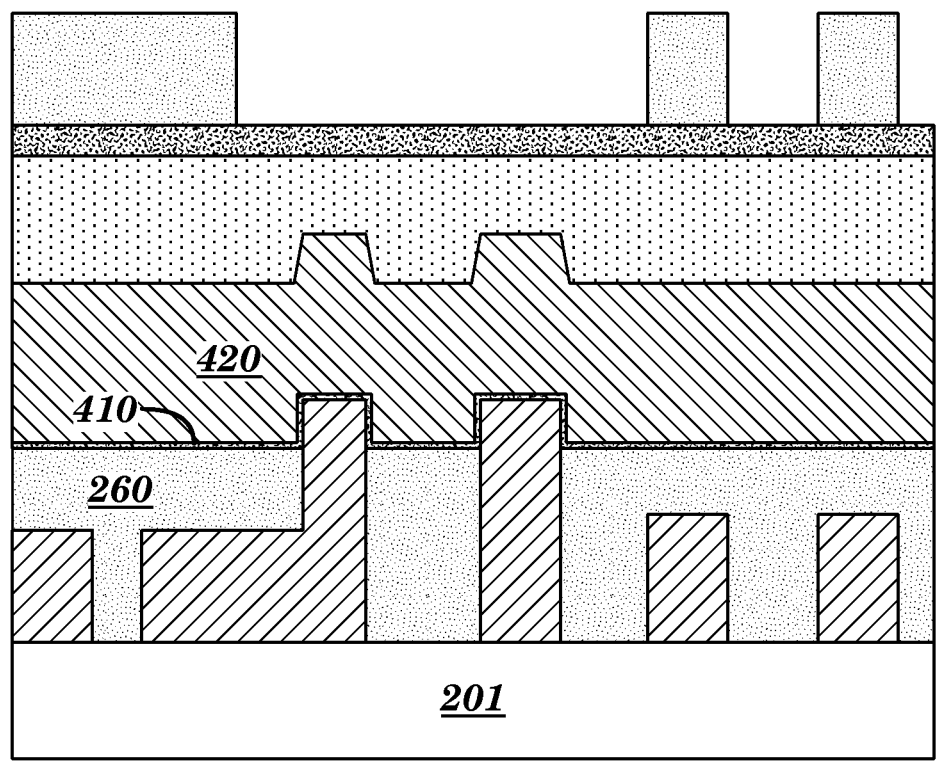
FIG. 6 is a cross sectional view of another embodiment of the present disclosure.

FIG. 4C illustrates an embodiment wherein at least one protrusions of the underlying layer (222) becomes part of the vias in the overlying layer (428), but that need not be the case. For example, FIG. 6 illustrates another embodiment where the mask is positioned and formed by reference to the protrusions, but does not actually cover the protrusions. The structure resulting from such a mask could define lines and/or vias that do not connect to the protrusions of the underlying layer.

Figure 7:
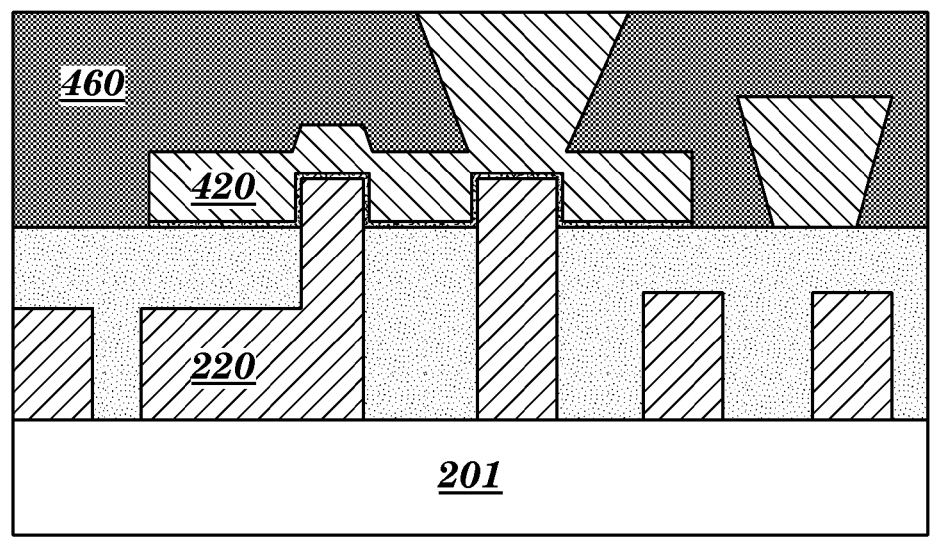
FIG. 7 is a cross sectional view of another embodiment of the present disclosure.

Referring again to FIG. 4C, via structure 428 in layer 420 has vertical or nearly vertical sides. FIG. 7 illustrates another embodiment wherein by modifying and controlling the metal etch process, structures with angled or shaped sides can be formed. The different tapered shapes can be achieved by appropriate etch chemistries, for example by the using of polymerizing gases.

In yet another embodiment, the structure includes at least one layer formed by conventional dielectric damascene covered by at least one layer formed by subtractive metal etch. Similar to the foregoing description regarding second metal layer 420, such embodiment would be formed by recessing the dielectric of such conventional damascene layer prior to depositing metal layer. The patterning of such metal layer could be accomplished just as described for layer 420.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a structure aligned with features underlying an opaque layer, the method comprising:
   forming an opaque layer over a first layer, said first layer having a surface topography that maps to at least one first feature embedded therein, the opaque layer formed such that said surface topography is visible over said opaque layer, and
   forming at least one second feature that includes a line and a via in said opaque layer by forming a first void in said opaque layer according to a first pattern and forming a second void in said opaque layer according to a second pattern such that a portion of said opaque layer is not included within either the first void or the second void.

2. The method of claim 1 wherein said opaque layer comprises tungsten.

3. The method of claim 1 further comprising:
   forming an adhesion layer directly on said first layer prior to said forming said opaque layer.

4. The method of claim 1 wherein said surface topography includes a protruding conductive feature, said protruding conductive feature being a via.

5. The method of claim 1 wherein said opaque layer comprises at least two metal materials selected from the group consisting of Al, Ru, W, Cr, Rh, V, Mo or alloys thereof.

6. The method of claim 5 wherein said line of said at least one second feature consists essentially of tungsten.

7. The method of claim 5 wherein said opaque layer includes a top material and at least one lower materials where said top material is different from any of said at least one lower materials, and said line of said at least one second feature consists essentially of said at least one lower materials.

8. A method of forming a structure aligned with features underlying an opaque layer, wherein said opaque layer is a metal layer, the method comprising:
   forming said opaque layer over a first layer, said first layer having a surface topography that maps to at least one first feature embedded therein, the opaque layer formed such that said surface topography is visible over said opaque layer;
   positioning at least one second feature in or above said opaque layer by reference to said topography;

forming said at least one second feature by subtractive metal etch of said opaque layer, wherein said subtractive metal etch comprises:

removing a first portion of said metal layer according to a first pattern;

filling the void formed by removal of said first portion with planarizing material;

removing a second portion of said metal layer to a second depth according to a second pattern, wherein a third portion of said metal layer is covered by said first pattern and is also covered by said second pattern; and applying dielectric material within the void formed by removal of said second portion.

9. The method of claim 8 wherein said first layer has at least one conductive feature embedded within dielectric material, the method further comprising:

forming said surface topography on said first layer by recessing said dielectric material such that one or more topographic elements protrudes.

10. The method of claim 9 wherein said topographic elements include said at least one first conductive feature.

11. The method of claim 9 wherein said topographic elements are formed of the same material as said at least one first conductive feature.

12. The method of claim 8 wherein said first pattern defines only vias.

13. The method of claim 8 wherein said at least one second feature includes a line that has a narrower cross section at the top than at the bottom.

* * * * *